United States Patent
Ahlquist et al.

(10) Patent No.: US 6,225,191 B1
(45) Date of Patent: *May 1, 2001

(54) PROCESS FOR THE MANUFACTURE OF OPTICAL INTEGRATED CIRCUITS

(75) Inventors: Louis Nelson Ahlquist, Clinton Township, Hunterdon County; Mark Anthony Cappuzzo, Linden; Louis T. Gomez, North Plainfield; Joseph Shmulovich, Murray Hill; Judith Martin Szalkowski, Plainfield, all of NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/635,252

(22) Filed: Apr. 12, 1996

(51) Int. Cl.[7] ............ H01L 21/46; H01L 21/78; H01L 21/301
(52) U.S. Cl. ............ 438/460; 438/33; 438/68; 438/113; 438/114; 438/458; 438/462; 438/464; 438/906; 438/115
(58) Field of Search .............. 438/33, 68, 113, 438/114, 458, 460, 462, 464, 906, 115, FOR 386, FOR 387, FOR 370

(56) References Cited

U.S. PATENT DOCUMENTS

| 5,174,124 | * | 12/1992 | Winebarger | 437/180 |
| 5,445,559 | * | 8/1995 | Gale et al. | 451/388 |
| 5,527,744 | * | 6/1996 | Mignardi et al. | 216/2 |
| 5,622,900 | * | 4/1997 | Smith | 438/464 |
| 5,668,062 | * | 9/1997 | Hyun et al. | 438/462 |
| 5,799,028 | * | 8/1998 | Geels et al. | 372/49 |

FOREIGN PATENT DOCUMENTS

2176908 * 7/1987 (GB).

* cited by examiner

*Primary Examiner*—Dwayne C. Jones
*Assistant Examiner*—C. Delacruix-Muirheid
(74) *Attorney, Agent, or Firm*—Peter V. D. Wilde; Thomas, Kayden, Horstemeyer & Risley LLP

(57) ABSTRACT

The specification describes wafer fabrication cleaning processes for silicon optical bench technology. The cleaning processes are designed to remove debris in situ after dicing silicon wafers mounted on a tape carrier. They were also developed specifically to avoid staining and residues that often result from using standard dicing approaches in silicon optical bench integrated circuit manufacture.

8 Claims, No Drawings

PROCESS FOR THE MANUFACTURE OF OPTICAL INTEGRATED CIRCUITS

TECHNICAL FIELD

The invention relates to silicon optical bench technology in which multiple optical or lightwave components are integrated on a silicon substrate. More particularly it relates to reducing or eliminating residues and stains on the surface of the optical integrated circuits that result from cleaning processes associated with the dicing operation.

BACKGROUND OF THE INVENTION

The evolution of lightwave technology follows in significant respects the development of silicon technology, in which the first devices were discrete components. Later came silicon device hybrid integration of a few devices on a substrate, followed by full integration of millions of devices on a small chip. The development of lightwave technology is progressing through the discrete component phase, in which lasers and photodetectors are packaged individually and coupled together with fiber pigtails, and in which passive devices like couplers and multiplexers are implemented using lengths of optical fiber. For the growth of this technology to continue on a learning curve comparable to silicon technology it is necessary to move to the next level, i.e. fully hybrid lightwave ICs. Although the integration of multiple optical components on a single substrate has been proposed in many forms, the successful migration of this technology to full hybridization requires the development of a reliable standard platform for integrating multiple lightwave components and subassemblies. There is a need for effective means for integrating monolithic arrays of active devices, as well as combinations of active and passive devices.

A strong candidate for this standard platform in future lightwave systems is silicon optical bench technology. The use of silicon as the basic substrate has several attractive aspects. Among these is the v-groove technology that was developed two decades ago for optical fiber couplers. In optical bench technology, the coupling of light between components of the hybrid lightwave circuit, as well as the coupling light at the input and output terminations of the circuit, can be implemented with great precision, and with passive alignment, using v-groove technology. Another attribute of silicon optical bench technology is that it uses the sophisticated silicon processing and processing equipment that has already been developed for silicon integrated circuits.

Among the techniques that optical bench technology has borrowed from silicon IC processing is the batch processing of integrated circuits on large silicon wafers. After fabrication of the integrated circuits, the wafers are affixed to tape carriers, then diced into discrete chips using diamond saws or laser scribing tools. The separated chips are then bonded to lead frames or ceramic substrates and packaged in e.g. a dual-in-line (DIP) package.

In the standard silicon wafer fabrication technique debris from the dicing operation is typically cleaned using a standard cleaning process. Much of the debris is removed using flowing water in the dicing apparatus, and that which remains in general does not create troublesome residue deposits and staining because the surface of the wafer is typically passivated, with the exception of small bonding pad areas.

In the manufacture of optical integrated circuits residual debris from the standard dicing operation has been found to be more troublesome. Residue deposits and staining of the integrated circuit surface are often so severe that the resulting product fails customer acceptance. This problem is attributed in part to the fact that the silicon wafers used in optical bench technology are thicker than those used in silicon IC fabrication. Thus the dicing operation typically produces more debris. In addition, major features of the surface of the optical integrated circuit are typically exposed during dicing, in contrast to the passivated surface of silicon ICs. An unclean surface at this stage in the process will interfere with wire bonding, soldering, positioning, and other attachment operations performed in later stages of fabrication. The surface of optical integrated circuits may comprise several materials, e.g. silicon, gold, platinum, titanium, that are more susceptible to staining than the deposited silicon oxide that is present at this stage in silicon IC processing. Moreover, the feature size in optical ICs is typically large, making stains that occur more visible.

These residues and stains in optical bench technology are not acceptable. Thus the need arises for a different approach to debris removal in the wafer dicing operation.

Cleaning operations at the chip level are either carried out by removing the chips from a tape carrier and mass cleaning in a cleaning solution either unrestricted or, to avoid damage to the chips, mounted in a special package. After cleaning, the chips are remounted on a tape carrier and inserted into the chip bonder, or are retained in the cleaning package for chip bonding. In either case, substantial handling of the individual chips is required.

It is much preferable to conduct the dicing debris clean-up at the wafer level. Mild cleaning operations can be implemented after dicing while the chips remain bonded to the tape carrier. However, we have found that mild cleansers are not adequate in solving the staining problem just outlined. The use of more aggressive cleaning agents, e.g. the strong acidic or basic solutions used in typical silicon IC fabrication, have been found effective in removing the stains, however they attack the adhesive on the tape carrier. Thus this approach leaves the process designer with the option earlier mentioned, with attendant cost and inconvenience, of performing the cleaning operation at the chip level.

Thus there is a need in optical bench technology for a process that successfully overcomes the staining problem after wafer dicing, and does not add a cleaning operation at the chip level.

SUMMARY OF THE INVENTION

We have developed wafer cleaning processes in which the cleaning operation is performed in situ after the wafer is diced and while the diced chips are still affixed to the tape carrier. The cleaning processes are fully consistent with maintaining the integrity of the adhesive tape carrier so that no chip handling is required between dicing and chip bonding.

One of these processes, and the preferred technique, is to apply a sacrificial protective layer to the wafer prior to dicing. Debris from the dicing operation deposits on the sacrificial layer. The sacrificial layer is then dissolved away in a relatively mild solvent, carrying the debris and the dissolved layer from the wafer surface. The essence of this approach lies in our discovery that solutions which are readily capable of dissolving the protective layer are at the same time benign to both the integrated circuit chips and the tape carrier to which they are adhesively affixed.

The first process that we have successfully demonstrated is the application of a photoresist layer to the wafer prior to dicing. In one embodiment the photoresist is a positive resist that is blanket exposed either before or after dicing. During the dicing operation debris from the diamond saw or the laser scribing tool, whichever is used, deposits on the photoresist layer. The photoresist layer is then exposed to a conventional photoresist developer. The developer completely dissolves the photoresist and lifts off the dicing debris.

It was found that solutions used for photoresist developing are both compatible with the tape carrier, and produce little or no residue or staining of the integrated circuit surfaces. We also found unexpectedly that photoresist developer is itself an effective debris cleaning agent, leaving no stain or residue, and can be used to advantage without the photoresist layer.

We also discovered, quite unexpectedly, that the layer typically used for photoresist adhesion is also effective as a debris protective layer. In this embodiment of our invention the photoresist adhesion promotion layer, e.g. hexamethyldisilazane (HMDS), is applied prior to dicing. After dicing the HMDS layer is removed with photoresist developer. The HMDS was found to perform in a manner equivalent to the photoresist layer, and was also found to be fully compatible with the tape carrier and left no residues or stains. The mechanism by which the adhesion promoting material functions to remove the dicing debris is not fully resolved but is believed to be partly due to surface passivation and partly due to a protective liftoff mechanism similar to that described above in connection with the use of photoresist protective layers. The passivation effect is due to the chemistry of adhesion promoting materials, i.e. they tie up surface bonds that might otherwise attract loose bonds of particulates and residue.

A significant advantage in the use of photoresist chemicals for the non-traditional purpose described here is that the benign effect of these chemicals on integrated circuit performance and aging is well documented, and there is total compatibility of the steps of the invention with known integrated circuit processing.

DETAILED DESCRIPTION

The effectiveness of the invention using photoresist materials was demonstrated using the following several processes. In the first process, Example I, the wafer dicing debris was cleaned using photoresist developer. The silicon wafers that are used in silicon optical bench technology have a thickness typically of 8–28 mils, usually 20–25 mils. The wafers, after fabrication of the optical integrated circuit components, are affixed to a tape carrier, e.g. NITTO tape, manufactured by Nitto of America. In the process of example I, the wafer on the tape carrier is diced, then subjected to the following debris removal process:

EXAMPLE I

| Step 1: | Mount wafer on adhesive tape carrier. |
|---|---|
| Step 2: | Dice wafer in dicing apparatus. Leave diced chips on tape carrier and proceed with cleaning dicing debris. |
| Step 3: | Start the cascade |
| Step 4: | Wipe dicing frame with propanol to remove oil or dirt from the frame. |
| Step 5: | Pour cleaning solution into the aspirator bottle. Cleaning solution = 3:1, 3 parts DI water to 1 part AZ400K Photoresist Developer. |
| Step 6: | Spray wafer in slow uniform passes for 2 minutes. Wafer should be ¼" to ½" from spray nozzle. Spray entire wafer then rotate dicing frame 90° CCW and continue cleaning. |
| Step 7: | Rinse wafer in cascade for 5 minutes. |
| Step 8: | Carry wafer to spin dryer with DI water covering the wafer. |
| Step 9: | Place wafer in spinner to dry at 2500 rpm. |

After this cleaning procedure, characterized by the inclusion of photoresist developer in the cleaning solution, the dicing debris was effectively removed and the chips on the tape carrier were intact evidencing the compatibility of this process with the integrity of the chip carrier tape. Moreover there was no evidence of staining on the final integrated circuits.

In our demonstration of the invention we used developer solutions made by Hoechst-Celanese and designated AZ400K. Other developers, such as Shipley 453, 455, 457, would work equally well. The concentration of developer in the cleaning solution was not found critical. Solutions with 10% to 100% developer are suitable, however, concentrations of 50% or less are recommended to avoid the possibility of reaction with the tape carrier adhesive should extended exposures occur. The diluent is not critical as long as it is compatible with the tape carrier adhesive and does not contribute to the staining problem. DI water is typically used.

The dicing operation was standard in the art. We used a diamond saw dicer made by Micro Automation.

As indicated earlier, the invention in a preferred form involves the use of a protective layer, during the dicing operation, that functions as a dicing debris removal or lift-off layer. In the first example of this technique, Example II, the cleaning solution includes an effective amount of photoresist developer, as in Example I, but the sequence includes the additional step of coating the wafer with photoresist adhesion promoter as the protective layer, prior to dicing. The sequence is as follows:

EXAMPLE II

| Step 1: | Apply hexamethyldisilazane (HMDS) photoresist adhesion promoter to wafer with a small bulb pipette, spin at 3000 rpm for 30 seconds. |
|---|---|
| Step 2: | Mount IC wafer on adhesive tape carrier. |
| Step 3: | Dice wafer in dicing apparatus. Leave diced chips on adhesive tape carrier and proceed with cleaning dicing debris. |
| Step 4: | Start the cascade. |
| Step 5: | Wipe dicing frame with propanol to remove oil or dirt on the frame. |
| Step 6: | Spray wafer in slow uniform passes for 3 min. for 4" wafer, or 5 min. for 5" wafer. Wafer should be ¼" to ½" from spray nozzle. Spray entire wafer then rotate dicing frame 90° CCW and continue cleaning. |
| Step 7: | Rinse wafer in the cascade for 5 minutes. |
| Step 8: | Carry wafer to spin dryer with DI water covering the wafer. |
| Step 9: | Place wafer in spinner at 2500 rpm to dry. |

As a result of this cleaning process the integrated circuit features showed substantially reduced staining as compared with circuits processed using the prior art cleaning technique. The cleaning solution, with the developer as an essential component, effectively removed the HMDS along with the debris from the dicing operation.

Adhesion promoters useful for the purposes of this invention have in general molecular structures that are asymmetric. Prominent examples of these materials are silanes such as HMDS and Trichlorophenylsilane (TCPS) diluted in e.g. xylene. These materials are frequently referred to as photoresist primers, which reference will be adopted in the definitions of this invention. Other known examples of photoresist adhesion promoters or primers are Bis trimethylsilylacetimide (BSA), Monazoline C, Trichlorobenzene, and Xylene. The photoresist primer material may be applied by known techniques such as puddle or spray coating, spin coating, or vapor coating. We found excellent results using vapor priming, partly due to the excellent step coverage and layer uniformity. The features on some optical integrated circuits are more severe than those encountered in typical IC processing, making vapor priming a preferred choice. Moreover, vapor priming is usually a batch process allowing very large numbers of wafers to be primed at a time.

In the following example, Example III, a photoresist layer is employed to remove the debris from the dicing operation. The photoresist layer functions as a liftoff layer to remove particulate contaminates. The process sequence is the following:

EXAMPLE III

| | |
|---|---|
| Step 1: | Apply HMDS to wafer with a small bulb pipette, spin at 3000 rpm for 30 seconds. |
| Step 2: | Spin on AZP 4110 or AZP 4620 photoresist at 5000 rpm for 30 seconds. |
| Step 3: | Soft bake at 88° C. for 30 minutes in oven. |
| Step 4: | Flood expose the photoresist for 10 minutes. |
| Step 5: | Using spinner at 2000 rpm and small chuck, remove photoresist edge bead from the back edges by spraying with acetone for 5 seconds and then propanol for 5 seconds. Spin dry. |
| Step 6: | Inspect photoresist coverage. |
| Step 7: | Mount IC wafer on adhesive tape carrier. |
| Step 8: | Dice wafer in dicing apparatus. Leave diced chips affixed to adhesive tape carrier and proceed with cleaning. |
| Step 9: | Wipe dicing frame with propanol to remove oil or dirt on the frame. |
| Step 10: | Pour cleaning solution into the aspirator bottle. Cleaning solution = 3:1. 3 parts DI water to 1 part AZ400K Developer. |
| Step 11: | Pour cleaning solution into battery jar. Add the spin bar. Set the spinner to FAST. Cleaning solution = 0.5:1 0.5 part DI water to 1 part AZ400K Developer. |
| Step 12: | Spray wafer in slow uniform passes for 5 minutes. Wafer should be ¼" to ½" from spray nozzle. Spray entire wafer then rotate dicing frame 90° CCW and continue cleaning. |
| Step 13: | Start the cascade. |
| Step 14: | Place the wafer side down in the cleaning solution in battery jar for 2 minutes. |
| Step 15: | Remove the wafer from battery jar and spray front and back of wafer with DI water. |
| Step 16: | Rinse the wafer in the cascade for 5 minutes. |
| Step 17: | Carry wafer to spin dryer with DI water covering the wafer. |
| Step 18: | Place wafer in spinner at 2500 rpm to dry. |

As a result of the photoresist liftoff cleaning process the cleaned wafer showed substantially no staining, and the chips affixed to the tape carrier remained intact and ready for the chip bonding operation.

It will be appreciated that in the process described here the photoresist is used in a totally non-conventional way. It is not patterned for use as a mask layer but is blanket deposited, blanket exposed, and blanket removed. Accordingly, many of the considerations that are generally important in photoresist technology, such as surface defects, pinholes, contamination, swelling, adhesion, undercutting, stress effects, imaging quality and response, etc., are relatively unimportant in this process. It will also be appreciated that the step of stripping patterned photoresist, typical of the usual photoresist sequence, is absent in these processes.

As indicated before the blanket exposure of the photoresist can occur either before or after dicing. However, if the photoresist layer is unexposed prior to dicing, and large amounts, or large particulates, are deposited on the layer during dicing, these particulates may interfere with later exposure of the photoresist. Thus it is preferred that the blanket exposure of the photoresist occur prior to dicing. In the foregoing example, we used a positive photoresist layer that was exposed by appropriate actinic radiation to render the photoresist resin soluble in the developer. The alternative of using negative photoresist layers is an equivalent approach, in which case the actinic exposure is not required. The developer in such a case removes the unexposed material. Again, since the photoresist is not used in a masking mode the options available to the process designer are relatively unconstrained.

The specific positive photoresist used in this demonstration was an AZP photoresist available from Hoechst-Celanese. It will be appreciated to those skilled in the art that the function of the photoresist in this technique is as a lift-off agent, and that any conventional photoresist material would be suitable. The thickness of the photoresist layer also is not critical. Typically it should be thick enough for step coverage but in the event all steps are not covered according to manufacturers recommendation for masking, i.e. patterning, that function is not served here so thinner layers than normal may suffice.

In the example given above, an adhesion promoter was used with the photoresist, but the adhesion promoter is not essential when using a photoresist liftoff layer. As is evident from earlier discussion, HMDS with photoresist provides two sacrificial protective layers, and in combination with the effectiveness of the developer rinse itself, gives added assurance of successful results. To aid in choosing between the alternatives of the invention it may be helpful to note that the removal of an HMDS layer proceeds faster than removal of a photoresist layer. It is so rapid that the added use of HMDS with photoresist adds insignificantly to the process time or steps. The developer removes both in a single step.

The choice of developer is not critical as long as it is formulated to effectively remove the photoresist. The normal choice is to follow the recommendations of the photoresist supplier.

Various additional modifications of the process described in the foregoing specification will occur to those skilled in the art. All such variations that rely essentially on the principles described herein, and to the extent they have advanced the art, are properly considered to be within the scope of the invention and alternatives thereof as defined in this specification and the appended claims.

We claim:

1. Process for the manufacture of optical components comprising the steps of:
   (a) fabricating a plurality of optical components on the surface of a silicon wafer,
   (b) after fabrication in step (a) is complete, coating the silicon wafer with a protective sacrificial layer, said sacrificial layer selected from the group consisting of Hexamethyldisilazane (HMDS), Trichlorophenylsilane (TCPS), Bistrimethylsilyacetimide (BSA), Monazoline C, Trichlorobenzene, and Xylene,
   (c) mounting the silicon wafer on an adhesive tape carrier,
   (d) dicing the silicon wafer into individual chips thereby creating dicing debris,
   (e) removing the sacrificial layer thereby removing the dicing debris from the chips, and
   (f) packaging the individual chips into a device package.

2. The process of claim 1 in which the sacrificial layer is Hexamethyldisilazane.

3. Process for the manufacture of optical components comprising the steps of:
   (a) fabricating a plurality of optical components on the surface of a silicon wafer,
   (b) after fabricating in step (a) is complete, coating the entire silicon wafer with a positive photoresist layer, said photoresist layer remaining unpatterned during said process,
   (c) flood exposing said photoresist layer,
   (d) mounting the silicon wafer on an adhesive tape carrier,
   (e) dicing the silicon wafer into individual chips thereby creating dicing debris,
   (f) removing the photoresist layer thereby removing the dicing debris from the chips, and
   (g) packaging the individual chips into a device package.

4. The process of claim 3 where the photoresist layer is removed using a solution comprising photoresist developer.

5. Process for the manufacture of optical components comprising the steps of:
   (a) fabricating a plurality of optical components on the surface of a silicon wafer,
   (b) after fabricating in step (a) is complete, coating the entire silicon wafer with a positive photoresist layer, said photoresist layer remaining unpatterned during said process,
   (c) mounting the silicon wafer on an adhesive tape carrier,
   (d) dicing the silicon wafer into individual chips thereby creating dicing debris,
   (e) flood exposing said photoresist layer,
   (f) removing said photoresist layer thereby removing the dicing debris from the chips, and
   (g) packaging the individual chips into a device package.

6. The process of claim 5 where the photoresist layer is removed using a solution comprising photoresist developer.

7. Process for the manufacture of optical components comprising the steps of:
   (a) fabricating a plurality of optical components on the surface of a silicon wafer,
   (b) after fabricating in step (a) is complete, coating the entire silicon wafer with a negative photoresist layer, said negative photoresist layer remaining unexposed to actinic radiation during said process,
   (c) mounting the silicon wafer on an adhesive tape carrier,
   (d) dicing the silicon wafer into individual chips thereby creating dicing debris,
   (e) flood exposing said photoresist layer,
   (f) removing said photoresist layer thereby removing the dicing debris from the chips, and
   (g) packaging the individual chips into a device package.

8. The process of claim 7 where the photoresist layer is removed using a solution comprising photoresist developer.

* * * * *